United States Patent [19]

Breining et al.

[11] 4,141,608

[45] Feb. 27, 1979

[54] CIRCUITRY FOR DRIVING A NON-LINEAR TRANSDUCER FOR ULTRASONIC CLEANING

[75] Inventors: Franklin E. Breining, Toms River; Franklin H. Edelstein, Kearny, both of N.J.

[73] Assignee: L & R Manufacturing Company, Kearny, N.J.

[21] Appl. No.: 850,302

[22] Filed: Nov. 10, 1977

[51] Int. Cl.[2] .............................................. H01L 41/10

[52] U.S. Cl. ...................................................... 310/316

[58] Field of Search .......................... 310/316, 317, 26; 318/116, 118

[56] References Cited

U.S. PATENT DOCUMENTS

| | | | |
|---|---|---|---|
| 3,318,578 | 5/1967 | Branson | 310/316 X |
| 3,432,691 | 3/1969 | Shoh | 310/316 |
| 3,668,486 | 6/1972 | Silver | 310/316 X |
| 3,681,626 | 8/1972 | Puskas | 310/316 |
| 3,736,523 | 5/1973 | Puskas | 310/316 X |

*Primary Examiner*—Mark O. Budd

*Attorney, Agent, or Firm*—Lerner, David, Littenberg & Samuel

[57] ABSTRACT

A circuit is disclosed for providing an 80 kilohertz sine wave to an ultrasonic transducer which includes an 80 kilohertz square wave generator driving a transistor having the primary of a transformer in its collector circuit. The secondary of the transformer drives a power transistor which has the transducer drive circuitry in its collector circuit. The transducer drive circuitry includes a transformer whose primary is connected in series with an inductor. The secondary of the transformer drives the transducer and has a capacitor connected thereacross. A third winding of the transformer is connected to have its output rectified to serve as a power supply for the square wave generator.

3 Claims, 1 Drawing Figure

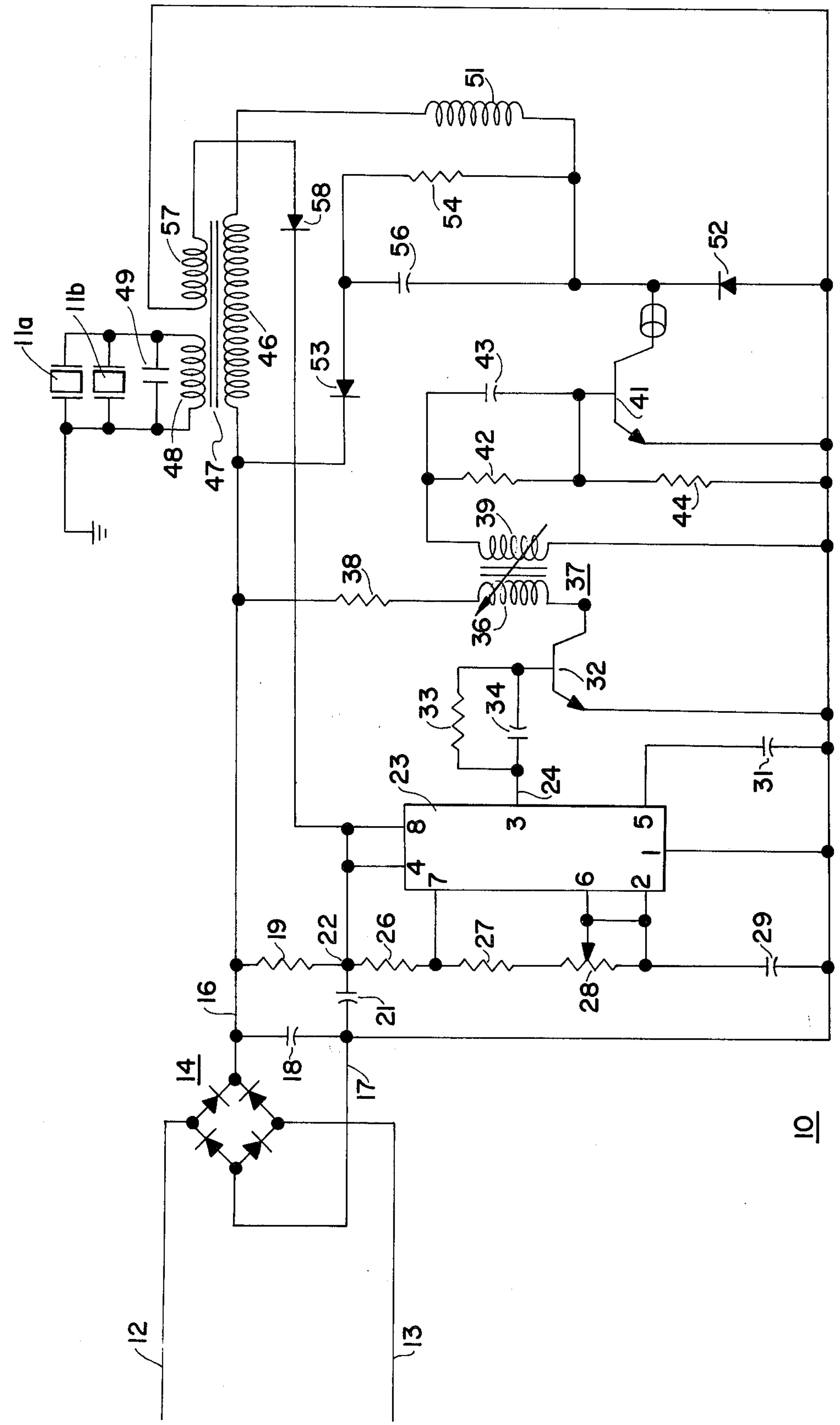
11a
11b
49
57
58
51
54
56
52
48
47
46
53
43
41
42
44
39
38
37
36
32
33
34
23
24
31
8
3
5
4
7
6
2
1
19
22
26
27
29
28
16
21
18
14
17
10
12
13

CIRCUITRY FOR DRIVING A NON-LINEAR TRANSDUCER FOR ULTRASONIC CLEANING

FIELD OF THE INVENTION

This invention relates to transducer drive circuitry, and particularly to transducer drive circuitry for ultrasonic cleaning equipment.

BACKGROUND OF THE INVENTION

Ultrasonic cleaning systems are employed in many industries. Specific systems have been designed to meet the sophisticated needs of the various industrial users.

Most ultrasonic cleaning systems in use today operate in the 20–50 kilohertz portion of the spectrum. These systems employ either blocking oscillators or two transistor square wave switching circuits to drive an ultrasonic transducer. These circuits suffer from many disadvantages and have not been extended beyond the frequency range discussed.

A frequency of 80 kilohertz would be more desirable for many ultrasonic cleaning tasks if it could be produced at a cost competitive with the lower frequency devices on the market.

The reason that 80 kilohertz would be more desirable than the lower frequency devices is that better cleaning of small parts could be accomplished because of the shorter wavelength without sacrificing cleaning of the larger parts. Further, a greater distribution of energy would be accomplished due to the shorter wavelength.

BRIEF DESCRIPTION OF THE INVENTION

In order to provide a circuit which can be economically employed for ultrasonic cleaning at 80 kilohertz, the present invention contemplates a circuit in which a non-linear ultrasonic transducer has a capacitor connected thereacross. An inductive reactance is effectively connected in series with the non-linear transducer and capacitor to form a non-linear series resonant circuit. A square wave is applied across the non-linear series resonant circuit thereby driving the ultrasonic transducer with essentially a sine wave signal.

In the preferred embodiment of this invention, a square wave generator drives a transistor which has the primary of a transformer in its collector circuit in series with an inductor. The secondary of the transformer is connected across the parallel circuit so that the transistor is operated in a switching mode dissipating a minimal amount of power and yet the non-linear series resonant circuit provides this square wave power to the non-linear ultrasonic transducer as essentially a sine wave.

The transformer has a third winding whose output is rectified and fed back as the power supply for the square wave generator. In this way, a separate DC power supply is eliminated thereby keeping the cost of the circuit down while providing short-circuit protection for the circuit.

DESCRIPTION OF THE DRAWING

For a more complete understanding of the invention, reference should be made to the accompanying drawing which shows the preferred embodiment of the circuit embodying the principles of this invention.

DETAILED DESCRIPTION OF THE INVENTION

Referring now to the FIGURE, a circuit 10 is shown embodying the principles of this invention. The circuit 10 is designed to drive a pair of ultrasonic transducers **11*a* and 11*b*. The ultrasonic transducers 11*a* and 11*b* have non-linear electrical characteristics in that the losses and the loading vary non-linearly with the amplitude of excitation applied thereto. In this case, the transducers 11*a* and 11*b* produce useful output at 80 kilohertz and the circuit 10** is designed to drive them at that frequency.

The circuit 10 derives power from a standard AC power source as provided by most utility companies in the United States, on leads 12 and 13. This AC power is rectified by a full wave bridge 14 to provide full wave rectified power between the leads 16 and 17. A capacitor 18 is connected between the leads 16 and 17 to provide a low impedance source for the 80 kilohertz. This capacitor is not designed to remove the characteristic waveform of the full wave rectified signal. A resistor 19 and a capacitor 21 are also connected between the leads 16 and 17 to provide just enough energy to get the circuit started. The resistor 19 is designed to limit the current which can be provided therethrough. A square wave generator 23 is connected between the junction 22 and the lead 17 to provide a square wave signal on an output lead 24. The square wave generator 23 can be, for example, a standard unit sold by many semiconductor manufacturers in the United States. For example, it can be an MC 1555 sold by Motorola Semiconductors and described in literature published by that company in 1973. Similar units are produced by other manufacturers under designations such as NE 555/SE 555. The square wave generator has connected thereto resistors 26, 27 and 28, as well as capacitors 29 and 31, in accordance with standard biasing requirements as set forth in the literature of manufacturers thereof.

The resistor 19 and capacitor 21 are selected to provide an amount of current close to the marginal operating threshold of the square wave generator 23. It is an important aspect of this invention that the resistor 19 not provide enough current to fully drive the square wave generator 23 to provide a full signal at its output terminal 24, but only sufficient current to provide a small less than standard output.

The output terminal 24 of the square wave generator 23 is connected to a transistor 32 through resistor 33 and speed-up capacitor 34. The collector circuit of the transistor 32 includes the primary 36 of a transformer 37 in series with resistor 38 which is connected back to the power lead 16. The transformer 37 has a ferrite core which is adjustable to vary the coupling between the primary 36 and the secondary 39 thereof. The secondary 39 of the transformer 37 drives transistor 41 through resistor 42 and speed-up capacitor 43. A resistor 44 is included for biasing purposes in the base circuit of the transistor 41.

The collector circuit of the transistor 41 includes the primary 46 of a transformer 47. The secondary 48 of the transformer 47 is connected directly across the transducers **11*a* and 11*b* and has a capacitor 49 connected thereacross to form a parallel circuit with the transducers 11*a* and 11*b*. An inductor 51 is in series with the primary 46 connecting the same to the collector of transistor 41. A pair of diodes 52 and 53, together with resistor 54 and capacitor 56 complete the collector circuit of the transistor 41. The diode 53, the resistor 54 and the capacitor 56 are employed to limit the voltage excursion of the collector of the transistor 41** and to suppress certain high frequency components in the collector waveform.

The inductor 51 (includes the leakage inductance of the transformer 47 and in certain instances may comprise solely such leakage inductance) is chosen to form a series resonant circuit with the capacitor 49 and the capacitance of the transducers 11*a* and 11*b* at the fundamental frequency of the square wave provided by the square wave generator 23. In this way, the transistor 41 is operated in a switching condition, being either ON or OFF during the major portions of the operation thereof. This limits the power dissipated by the transistor 41. On the other hand, by having the series resonant circuit the power delivered to the transducers 11*a* and 11*b* are sinusoidal in nature providing the waveform to the transducers required by them.

Normally, one would not expect to provide the capacitor 49. If the transducers 11*a* and 11*b* were linear, the capacitor 49 would not serve a useful function. It has been found that the equivalent circuit of the transducers 11*a* and 11*b* are essentially a resistor in series with a capacitance which are non-linear with amplitude and frequency. If the inductor 51 were tuned to the capacitance exhibited by the transducers 11*a* and 11*b*, the power from the fundamental of the square wave would be provided to such transducers. The higher frequency components, however, could be filtered out by the resonant effect of the series resonant circuit. By providing the capacitor 49 to augment the capacitance of the transducers 11*a* and 11*b*, a lower value of inductance is provided in the inductor 51. This lowers the Q of the series resonant circuit thereby allowing the higher frequency components of the square wave to be presented to the transducers 11*a* and 11*b*. This is done in accordance with the teachings of this invention which is based upon the recognition that the non-linear characteristics of the transducers 11*a* and 11*b* substantially provide the higher frequency energy thus passed by the lower Q series resonant circuit to the transducers 11*a* and 11*b* at the fundamental frequency. This is due to the non-linear characteristics of the transducers 11*a* and 11*b*. In this way, a circuit has been provided which is highly efficient in that a square wave drive is provided by the transistor 41 so as not to dissipate undue amounts of power in the driver stage and yet the power which would otherwise be thought to be filtered out and unusable at the frequency of interest is provided to the transducers 11*a* and 11*b* due to the use of the capacitor 49, and therefore the lowered value of inductance 51 based upon the recognition of the effect of the non-linearities of the transducers 11*a* and 11*b*.

The transformer 47 has an additional winding 57 which is rectified by diode 58 and fed back to the square wave generator 23 at the junction 22. Thus, it is seen that the output of the winding 57 is rectified and provided to the square wave generator as a power supply. The main power for driving the square wave generator 23 is derived from the winding 57. As pointed out above, resistor 19 limits the current provided to square wave generator 23 to a minimum value so as to only provide a minimal output on lead 24. As the signal from the output of the square wave generator 23 drives the remaining circuitry, a small amount of the energy is fed back through winding 57 to increase the power provided to the square wave generator 23. This in turn increases the output on the lead 24 until the circuit stabilizes at a normal operating level. As a result, a slow start-up circuit is provided wherein the start-up time is built into the transit time through the circuitry described. Further, if a short-circuit condition occurs at the output of the secondary 48 of the transformer 47 the signal on the winding 57 will also be eliminated thus turning off the power drive to the square wave generator 23. This in turn will limit the drive through the transistor 41. As a result, the circuit 10 inherently has short-circuit protection. A further advantage of the use of the winding 57 is the elimination of the need for a separate DC power supply to drive the square wave generator 23. It should be noted that the remaining circuitry derives its power from the half-wave rectified signal provided between the leads 16 and 17 which is substantially unfiltered.

In this regard, it should be noted that the resistor 38 is connected to the lead 16 so that the power drive to the base circuitry of transistor 41 has the full wave rectified envelope which is also the power supply to the collector circuitry and thus to the transducers 11*a* and 11*b*.

While this invention has been described with respect to a particular embodiment thereof, numerous others will become obvious to those of ordinary skill in the art in the light thereof.

What is claimed is:

1. In combination:

a non-linear ultrasonic transducer having first and second terminals;

a capacitor connected between said first and second terminals to form a parallel circuit with said non-linear transducer;

means for exhibiting an inductive reactance in series with said parallel circuit to thereby form a non-linear series resonant circuit having a series resonant frequency; and means for applying a square wave having a fundamental frequency substantially equal to said series resonant frequency across said series resonant circuit;

said means for applying said square wave includes a transistor and said means for exhibiting said inductive reactance includes an inductor connected in the collector circuit of said transistor, and a transformer having a primary and a secondary; said primary being connected to said inductor and said secondary being connected across said parallel circuit.

2. The combination as defined in claim 1 in which said means for applying said square wave further includes a square wave generator for providing said square wave to said transistor and said transformer includes a third winding; said combination further including means for rectifying the signal provided by said third winding, and applying the same as a power supply to said square wave generator.

3. The combination as defined in claim 2 in which said means for applying said square wave also includes a transformer having an adjustable magnetic core interposed between said square wave generator and said transducer to vary the duty cycle of said square wave.

* * * * *